US010109353B2

(12) United States Patent
Ueno et al.

(10) Patent No.: US 10,109,353 B2
(45) Date of Patent: Oct. 23, 2018

(54) MEMORY DEVICE

(71) Applicant: Toshiba Memory Corporation, Tokyo (JP)

(72) Inventors: Koki Ueno, Kanagawa (JP); Yasuhiro Shiino, Kanagawa (JP); Asuka Kaneda, Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/639,411

(22) Filed: Jun. 30, 2017

(65) Prior Publication Data

US 2018/0005698 A1 Jan. 4, 2018

(30) Foreign Application Priority Data

Jul. 1, 2016 (JP) .................................. 2016-131826

(51) Int. Cl.
| G11C 16/06 | (2006.01) |
| G11C 16/10 | (2006.01) |
| G11C 16/04 | (2006.01) |
| G11C 16/34 | (2006.01) |

(52) U.S. Cl.
CPC .......... *G11C 16/10* (2013.01); *G11C 16/0483* (2013.01); *G11C 16/3459* (2013.01)

(58) Field of Classification Search
CPC ..... G11C 16/10; G11C 16/3459; G11C 16/34; G11C 16/0483

USPC ............ 365/185.22, 185.17, 185.23, 185.33
See application file for complete search history.

(56) References Cited

U.S. PATENT DOCUMENTS 6,233,668 B1 * 5/2001 Harvey ............... G06F 12/1009
711/147

FOREIGN PATENT DOCUMENTS

| JP | H09-331661 | 12/1997 |
| JP | 2006-325297 | 11/2006 |
| JP | 2014-017059 | 1/2014 |
| JP | 2014-176263 | 9/2014 |

* cited by examiner

*Primary Examiner* — Gene Auduong
(74) *Attorney, Agent, or Firm* — Patterson & Sheridan, LLP

(57) ABSTRACT

A memory device includes a plurality of memory cell transistors, a word line electrically connected to gates of the memory cell transistors, and a control circuit configured to perform programming of the memory cell transistors to a plurality of different threshold voltage ranges in a plurality of loops, each loop including a program operation and a program verification. The different threshold voltage ranges include a first threshold voltage range and a second threshold voltage range that is at a higher voltage than the first threshold voltage range. Further, during the program operation, the control circuit applies a program voltage to the word line, the program voltage increasing for each subsequent loop, an amount of increase of the program voltage when programming to the second threshold voltage range being set in accordance with a number of loops required to complete programming to the first threshold voltage range.

19 Claims, 13 Drawing Sheets

FIG. 9

| A-LEVEL PASS LOOP NUMBER (NAP) | VREAD | ΔVPGM | VVC | VVD | VVE | VVF | VVG |
|---|---|---|---|---|---|---|---|
| ≤r | 0 (INITIAL VALUE) | 0 (INITIAL VALUE) | 0 (INITIAL VALUE) | 0 (INITIAL VALUE) | 0 (INITIAL VALUE) | 0 (INITIAL VALUE) | 0 (INITIAL VALUE) |
| r=1 | ΔA1 | ΔB1 | ΔC1 | ΔD1 | ΔE1 | ΔF1 | ΔG1 |
| r=2 | ΔA2 | ΔB2 | ΔC2 | ΔD2 | ΔE2 | ΔF2 | ΔG2 |
| r=3 | ΔA3 | ΔB3 | ΔC3 | ΔD3 | ΔE3 | ΔF3 | ΔG3 |
| ... | ... | ... | ... | ... | ... | ... | ... |

MEMORY DEVICE

CROSS-REFERENCE TO RELATED APPLICATION

This application is based upon and claims the benefit of priority from Japanese Patent Application No. 2016-131826, filed Jul. 1, 2016, the entire contents of which are incorporated herein by reference.

FIELD

Embodiments described herein relate generally to memory devices.

BACKGROUND

A memory device that can hold data of 2 bits or more in one memory cell is known.

DESCRIPTION OF THE DRAWINGS

FIG. 9 depicts an example of a table which is held in a control circuit during an operation of the memory device of the embodiment;

DETAILED DESCRIPTION

Figure 1:
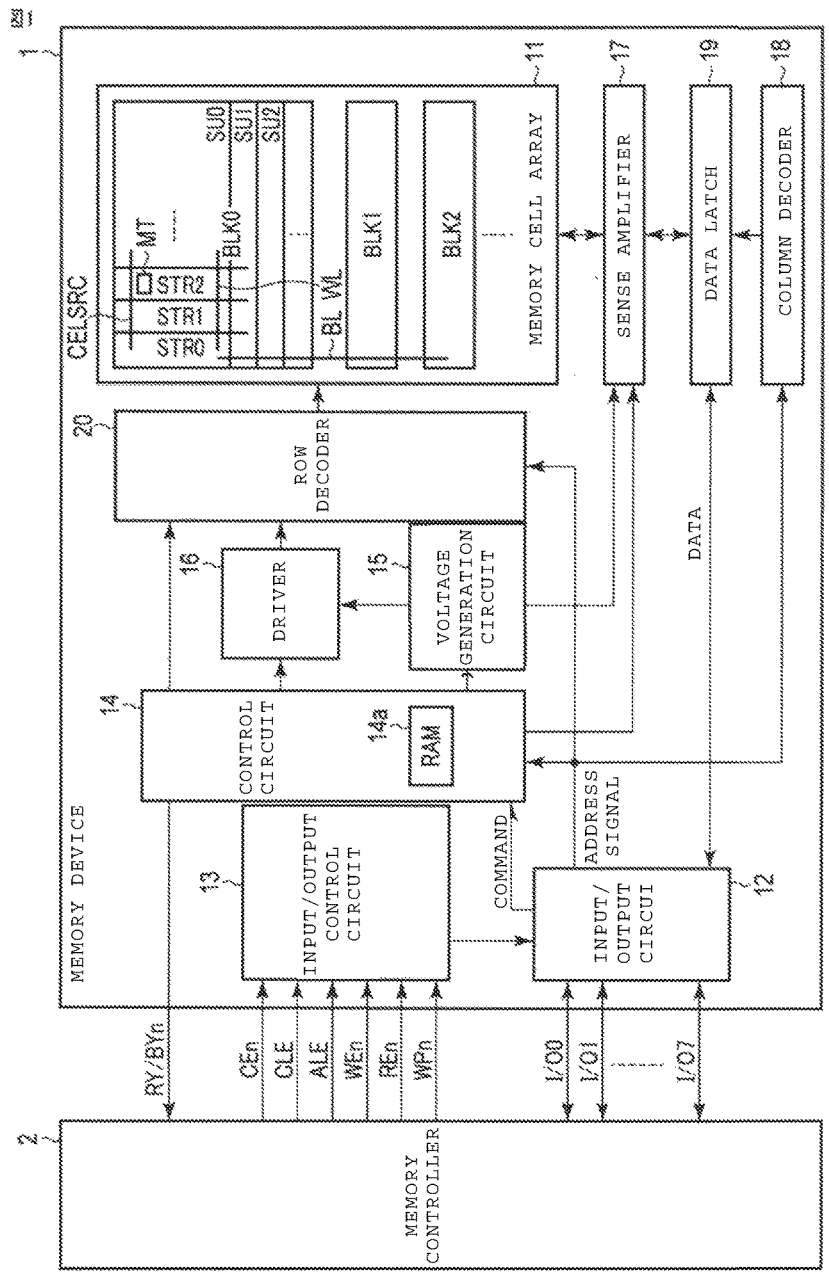
FIG. 1 depicts functional blocks of a semiconductor memory device of an embodiment.

Embodiments provide a memory device that performs programming in a manner that is adapted for a plurality of cell transistors, some of which may be degraded.

In general, according to one embodiment, a memory device comprises a plurality of memory cell transistors, a word line electrically connected to gates of the memory cell transistors, and a control circuit configured to perform programming of the memory cell transistors to a plurality of different threshold voltage ranges in a plurality of loops, each loop including a program operation and a program verification. The different threshold voltage ranges include a first threshold voltage range and a second threshold voltage range that is at a higher voltage than the first threshold voltage range. Further, during the program operation, the control circuit applies a program voltage to the word line, the program voltage increasing for each subsequent loop, an amount of increase of the program voltage when programming to the second threshold voltage range being set in accordance with a number of loops required to complete programming to the first threshold voltage range. Hereinafter, an embodiment will be described with reference to the drawings. In the following description, component elements having almost the same function and configuration will be identified with the same characters and overlapping explanations are sometimes omitted. Each component element can be implemented as one of hardware and computer software or a combination thereof. Therefore, in order to make it clear that each component element is one of hardware and computer software or a combination thereof, the component element is generally described from the viewpoint of the function thereof, and used interchangeably herein with "functional block". Moreover, the functional blocks do not necessarily have to be distinguished from one another as in the following example. For example, part of the function of an illustrated functional block may be carried out by a functional block different from the illustrated functional block. Furthermore, an illustrated functional block may be divided into smaller functional sub-blocks.

The order of any step in the flow of a method of the embodiment is not limited to the order depicted in the drawing, and, unless otherwise specified, any step may be performed in an order different from the order depicted in the drawing and (or) in parallel with another step.

As used herein, the term "connected" refers to a state in which one component element is directly connected to another component element with a conductive element being placed therebetween.

1. Configuration (Structure)

FIG. 1 depicts functional blocks of a semiconductor memory device 1 of the embodiment. As depicted in FIG. 1, the memory device 1 communicates with a memory controller 2 and operates in accordance with instructions received from the memory controller 2.

The memory device 1 includes elements such as a memory cell array 11, an input/output circuit 12, an input/output control circuit 13, a control circuit (e.g., sequencer) 14, a voltage generation circuit 15, a driver 16, a sense amplifier 17, a column decoder 18, a data latch 19, and a row decoder 20.

The cell array 11 includes a plurality of cell transistors MT. The cell array 11 includes cell transistors MT which are connected to one another. Data may be programmed into the plurality of cell transistors MT by application of voltages associated with the data to the plurality of cell transistors MT multiple times. The cell array 11 may include additional elements and connections therebetween. Hereinafter, some specific examples will be described.

The cell array 11 further includes a plurality of memory blocks BLK (BLK0, BLK1, . . . ). A BLK is a data erasing unit, for example, such that data in each block BLK is collectively erased. However, a unit smaller than one block BLK (for example, one-half of the block BLK) may be a data erasing unit.

Each block BLK includes a plurality of string units (or chunks) SU (SU0, SU1, . . . ). Each string unit SU includes a plurality of NAND strings STR (STR0, STR1, . . . ). The string STR includes the cell transistors MT. In the cell array 11, wiring lines such as a word line WL, a bit line BL, a cell source line CELSRC, and select gate lines SGDL and SGSL are further provided.

The input/output circuit 12 sends and receives signals I/O (I/O0 to I/O7) having a certain bit width (for example, 8 bits) between the input/output circuit 12 and the memory controller 2. Each signal I/O contains a command, program data, read data, an address signal, and so forth. The program data is data which is sent from the memory controller 2 and is programmed into the plurality of cell transistors MT. The read data is data which is read from the plurality of cell transistors MT and is sent to the memory controller 2.

The input/output control circuit 13 receives various control signals from the memory controller 2 and controls the input/output circuit 12 based on the control signals. The control signals include, for example, signals CEn (Chip Enable), CLE (Command Latch Enable), ALE (Address Latch Enable), WEn (Write Enable), REn (Read Enable), and WPn (Write Protect). The letter n attached to the end of the name of a signal means that the signal is asserted if the signal is at a logic low level.

The asserted signal CEn enables the memory device 1. The asserted signal CLE notifies the memory device 1 that the signal I/O flowing through the memory device 1 in parallel with the asserted signal CLE is a command. The asserted signal ALE notifies the memory device 1 that the signal I/O flowing through the memory device 1 in parallel with the asserted signal ALE is an address. The asserted signal WEn gives an instruction to the memory device 1 to take in the signal I/O flowing through the memory device 1 in parallel with the asserted signal WEn. The asserted signal REn gives an instruction to the memory device 1 to output the signal I/O. The asserted signal WPn gives an instruction to the memory device 1 to disable programming and erasing of data.

The control circuit 14 receives the command and the address signal from the input/output circuit 12 and controls the voltage generation circuit 15, the driver 16, the sense amplifier 17, and the column decoder 18 based on the command and the address signal. The control circuit 14 includes random-access memory (RAM) 14a. The control circuit 14 outputs a signal RY/BYn. The signal RY/BYn indicates whether the memory device 1 is in a ready state (a state in which the memory device 1 accepts an instruction from the outside) or a busy state (a state in which the memory device 1 does not accept an instruction from the outside), and a low level indicates the busy state.

The voltage generation circuit 15 receives power from the outside of the memory device 1 and generates various voltages from the received power. The generated voltages are supplied to the elements such as the driver 16 and the sense amplifier 17. The voltages which are generated by the voltage generation circuit 15 include, for example, voltages which are applied to the word line WL, the select gate lines SGDL and SGSL, and the source line CELSRC. The driver 16 receives the voltages generated by the voltage generation circuit 15 and supplies voltages selected from the received voltages to the row decoder 20 in accordance with instructions received from the control circuit 14.

The row decoder 20 receives various voltages from the driver 16, receives the address signal from the input/output circuit 12, selects one block BLK based on the received address signal, and transfers the voltages from the driver 16 to the selected block BLK.

The sense amplifier 17 senses the read data from the selected cell transistor MT and transfers the program data to the plurality of cell transistors MT.

The data latch 19 holds the program data from the input/output circuit 12 and supplies the program data to the sense amplifier 17. Moreover, the data latch 19 receives the read data from the sense amplifier 17 and supplies the read data to the input/output circuit 12 in accordance with instructions received from the column decoder 18. The column decoder 18 controls the data latch 19 based on the address signal.

2. (Cell Array)

Figure 2:
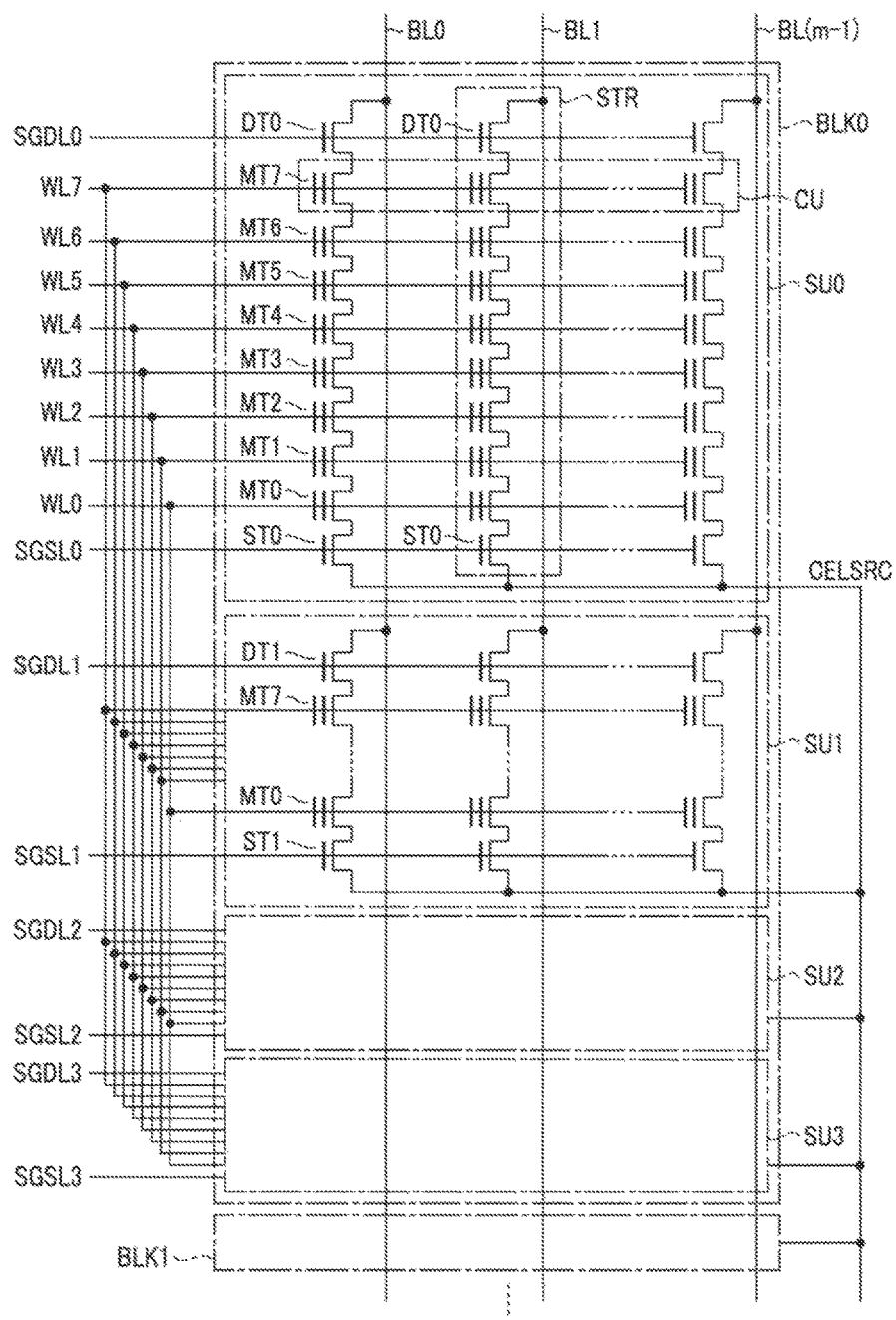
FIG. 2 depicts some of elements and connections of a cell array of the embodiment.
Figure 3:
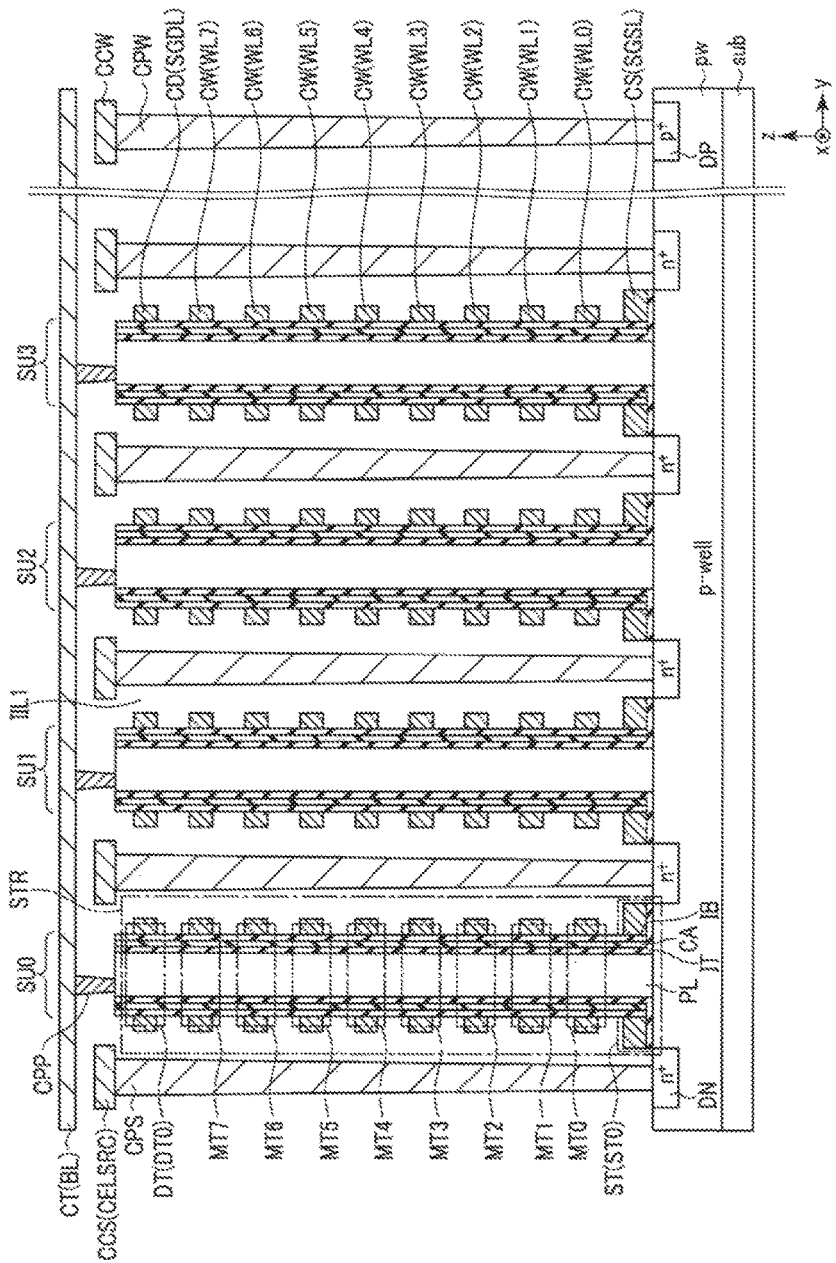
FIG. 3 depicts a first example of the structure of the cell array of the embodiment.
Figure 4:
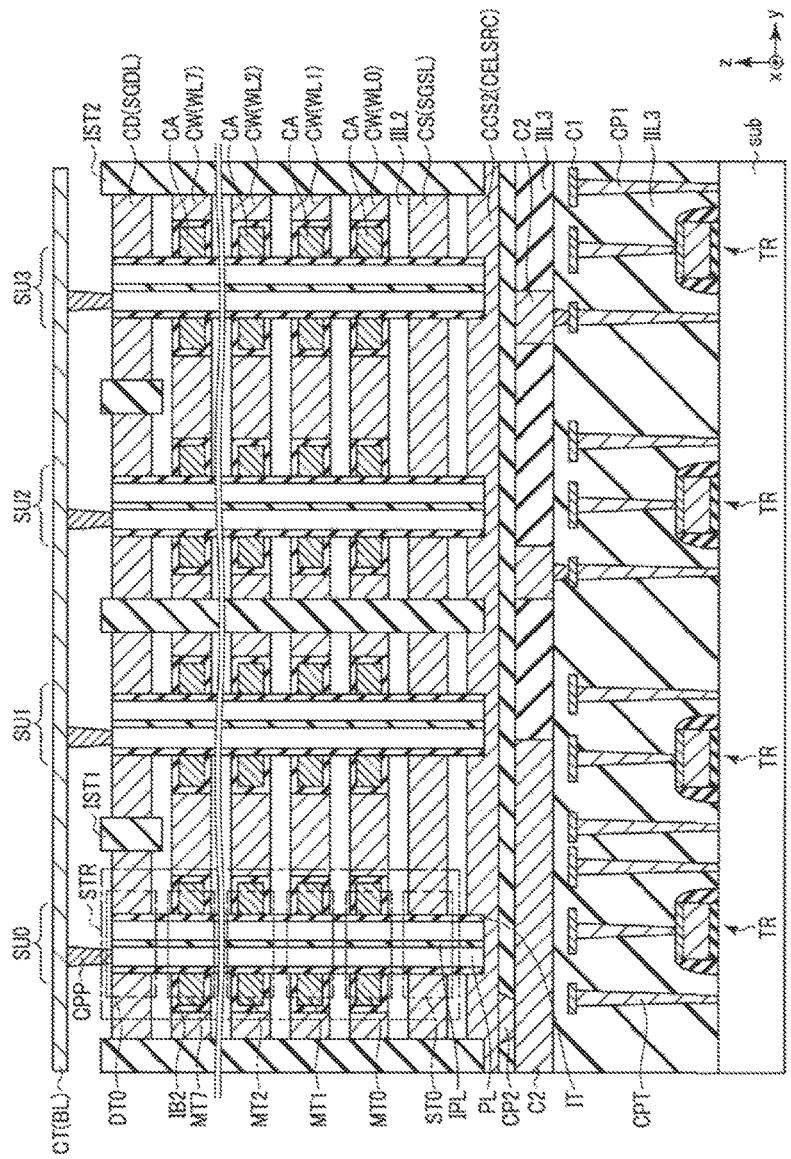
FIG. 4 depicts a second example of the structure of the cell array of the embodiment.

FIGS. 2 to 4 depict an example of the details of the cell array 11. FIG. 2 depicts an example of some of elements and connections of the cell array 11 of the embodiment. FIGS. 3 and 4 each depict an example of a structure which can implement the cell array 11 of the embodiment.

FIG. 2 depicts the details of, in particular, one block BLK0 and related component elements. The plurality of (for example, all the) blocks BLK include similar elements connected in a similar manner.

Each block BLK includes string units SU0 to SU3. In each block BLK, each of m (m is a natural number) bit lines BL0 to BLm−1 is connected to one string STR of each of the four string units SU0 to SU3.

Each string STR includes one select gate transistor ST (ST0 to ST3), a plurality of (for example, eight) cell transistors MT0 to MT7, and one select gate transistor DT (DT0 to DT3). The transistors ST, MT, and DT are connected, in this order, in series between the source line CELSRC and one bit line BL. Each cell transistor MT includes a control gate electrode that is a part of a word line WL (e.g., one of WL0 to WL7) and a charge storage layer insulated from the surroundings, and can hold data in a nonvolatile manner based on the amount of charge in the charge storage layer. Electrons are injected into the charge storage layer of the cell transistor MT by programming. The cell transistor MT with the charge storage layer into which the electrons were injected by programming is in a programmed state. On the other hand, the cell transistor MT into which the electrons are not injected is in an erased state. The cell transistor MT in an erased state is a cell transistor MT that passed erasing verification.

A set of strings STR, each being connected to each of the plurality of different bit lines BL, forms one string unit SU. In each string unit SU, the gate of a cell transistor MTx (x is 0 or any natural number which is smaller than or equal to 7) is connected to a word line WLx. Furthermore, in each block BLK, the word lines WLx in different string units SU are connected to one another. A set of the cell transistors MT sharing one of the word lines WL in one of the string units SU is referred to as a cell unit CU.

Transistors DTy and STy (y is 0 or any natural number which is smaller than or equal to 3) belong to a string unit SUy.

The gate of each of the transistors DTy of the plurality of strings STR of the string unit SUy is connected to a select gate line SGDLy. The gate of each of the transistors STy of the plurality of strings STR of the string unit SUy is connected to a select gate line SGSLy. The select gate lines SGSL of the plurality of string units SU in one block BLK may be connected to one another.

The cell array 11 has the structure depicted in FIG. 3 or 4, for example. FIGS. 3 and 4 each depict an example of the structure of the cell array 11. FIGS. 3 and 4 each depict a cross section in a y-z plane of part of the cell array 11. The cell array 11 has the same structure as the structure depicted in FIG. 3 or 4, when the cross section is taken along a different position along the x axis.

As depicted in FIG. 3, the string units SU are provided on a substrate sub. The substrate sub spreads in an x-y plane and includes a p-well pw in an upper surface of the substrate sub. Each string unit SU includes a plurality of strings STR arranged in the x-axis direction. Each string STR includes a semiconductor pillar PL. The pillar PL, extending along the z axis, is in contact with the p-well pw at a lower end thereof, and functions as a channel region in which channels of the transistors MT, DT, and ST are formed. An upper end of the pillar PL is connected to an electric conductor CT via a conductive plug CPP. The electric conductor CT extends along the y axis and functions as a bit line BL. Electric conductors CT located at different positions along the x axis are spaced apart from one another. The side face of the pillar PL is covered with a tunnel insulator IT. The tunnel insulator IT is located also on the p-well pw. The side face of the tunnel insulator IT is covered with a charge storage layer CA. The charge storage layer CA is insulating or conductive, and the side face thereof is covered with a block insulator IB.

In each string unit SU, one electric conductor CS, a plurality of (for example, eight) electric conductors CW, and one electric conductor CD are provided above the p-well pw. A plurality of electric conductors CS and a plurality of electric conductors CD may be provided. The electric conductors CS, CW, and CD are arranged at intervals in this order along the z axis, extending along the x axis, and are in contact with the block insulator IB. Moreover, the tunnel insulator IT is sandwiched between the electric conductor CS and the upper surface of the p-well pw. The electric conductors CS, CW, and CD function as the select gate line SGSL, the word lines WL0 to WL7, and the select gate line SGDL, respectively. In each string unit SU, the electric conductors CS, CW, and CD are in contact with the block insulators IB on the side faces of all the semiconductor pillars PL in this string unit SU.

The portions of the pillar PL, the tunnel insulator IT, the charge storage layer CA, and the block insulator IB, at which the pillar PL, the tunnel insulator IT, the charge storage layer CA, and the block insulator IB meet the electric conductors CS, CW, and CD, function as the select gate transistor ST, the cell transistors MT, and the select gate transistor DT, respectively. The transistors ST, MT, and DT, which share the pillar PL and are arranged along the z axis, form one string STR.

In a region on the upper surface of the p-well pw, a p+ impurity diffusion layer DP is provided. The diffusion layer DP is connected to an electric conductor CCW via a conductive plug (e.g., contact plug) CPW. The plug CPW spreads in the x-z plane.

In a region on the upper surface of the p-well pw, an n+ impurity diffusion layer DN is further provided. The diffusion layer DN is connected to an electric conductor CCS via the conductive plug CPS. The electric conductor CCS functions as the cell source line CELSRC.

In a region on the substrate sub where the electric conductors CS, CW, CD, CCS, and CCW and the plugs CPS and CPW are not provided, an insulator IIL1 is provided.

As depicted in FIG. 4, each string unit SU includes a plurality of strings STR arranged along the x-axis, is provided above a substrate sub, and further includes a pillar PL that is connected to an electric conductor CCS2 at a lower end thereof. The electric conductor CCS2 is located between the substrate sub and the pillar PL, spreads in the x-y plane, and functions as the cell source line CELSRC. Each pillar PL has an insulator IPL inside.

Each string unit SU is provided with a plurality of (for example, eight) charge storage layers CA above the electric conductor CCS2. The charge storage layers CA extend along the x axis, are arranged at intervals along the z axis, and are in contact with a tunnel insulator IT. The charge storage layers CA are either insulating or conductive. In four string units SU, four charge storage layers CA are located at virtually the same level. Each charge storage layer CA has an upper surface covered with a block insulator IB2.

Above the electric conductor CCS2, an electric conductor CS is provided. The electric conductor CS spreads in the x-y plane, functions as the select gate line SGSL, and is in contact with the tunnel insulator IT.

Above the electric conductor CCS2, a plurality of (for example, eight) electric conductors CW are provided. The electric conductors CW spread in the x-y plane and function as the word lines WL0 to WL7. Each electric conductor CW is located at virtually the same level as a corresponding one of the four charge storage layers CA, which are located at virtually the same level, of each of the four string units SU. Each electric conductor CW is in contact with the block insulator IB2 around a corresponding one of the four charge storage layers CA which are located at virtually the same level.

Above the uppermost electric conductor CW, an electric conductor CD is provided. The electric conductor CD spreads in the x-y plane and functions as the select gate line SGDL.

The portions of the pillar PL and the tunnel insulator IT, at which the pillar PL and the tunnel insulator IT meet the electric conductors CS and CD, function as the select gate transistors ST and DT, respectively. The portions of the pillar PL and the tunnel insulator IT, at which the pillar PL and the tunnel insulator IT meet the charge storage layer CA, the block insulator IB2, and the electric conductor CW, function the cell transistors MT. The transistors ST, MT, and DT, which share the pillar PL and are arranged along the z axis, form one string STR.

In the electric conductor CD, a plurality of insulators IST1 are provided. Each insulator IST1 extends along the x axis and divides the electric conductor CD into right and left portions on both sides of the insulator IST1 from the upper to lower end of the electric conductor CD. The insulator IST1 is provided between the string units SU0 and SU1 and between the string units SU2 and SU3.

In the electric conductors CS, CW, and CD, an insulator IST2 is provided. The insulator IST2 extends along the x axis and divides the electric conductors CS, CW, and CD into right and left portions on both sides of the insulator IST2 from the electric conductor CD to the electric conductor CCS2. The insulator IST2 is provided on the side of the string unit SU0 opposite to the string unit SU1, between the string units SU1 and SU2, and on the side of the string unit SU3 opposite to the string unit SU2.

The electric conductors CS, CW, and CD are in contact with the tunnel insulators IT on the side faces of all the pillars PL of all the string units SU0 to SU3 in one block BLK.

In a region above the electric conductor CCS2 where the electric conductors CCS2, CS, CW, and CD are not provided, an insulator IIL2 is provided.

Between the electric conductor CCS2 and the substrate sub, MOSFETs TR, electric conductors C1 and C2, and conductive plugs CPT, CP1, and CP2 are provided. The transistors TR are located on the upper surface of the substrate sub and form some of the functional blocks other than the cell array 11. Each transistor TR is connected to the plug CP2 via the plug CP1 and the electric conductors C1 and C2 in a gate or source/drain region. The plug CP2 is connected to the electric conductor CCS2.

In a region between the upper surface of the substrate sub and the electric conductor C1 where the transistors TR, the plugs CP1, and the electric conductors C1 and C2 are not provided, an insulator IIL3 is provided.

The structure of the cell array 11 may have the configuration described in, for example, U.S. Patent Application Publication No. 2009/0267128 entitled "Three Dimensional Stacked Nonvolatile Semiconductor Memory," U.S. Patent Application Publication No. 2009/0268522 entitled "Three Dimensional Stacked Nonvolatile Semiconductor Memory," U.S. Patent Application Publication No. 2010/0207195 entitled "Non-volatile Semiconductor Storage Device and Method of Manufacturing the Same," and U.S. Patent Application Publication No. 2011/0284946 entitled "Semiconductor Memory and Method for Manufacturing Same." The entire contents of all of these patent applications are incorporated herein by reference.

3. (Cell Transistor)

Figure 5:
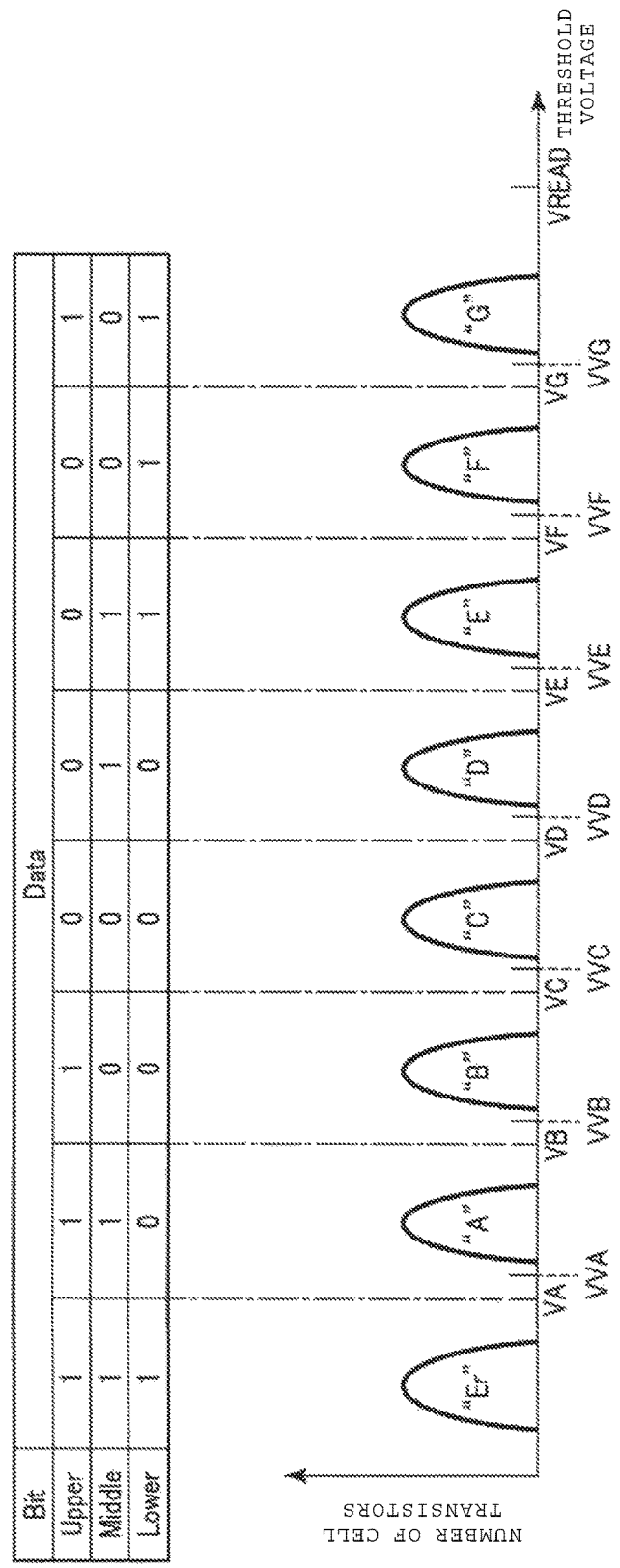
FIG. 5 depicts an example of the relationship of data which is held in a cell transistor of the memory device of the embodiment and threshold voltages.

The cell transistors MT will be described with reference to FIG. 5. The memory device 1 can hold data of 3 bits or more in one cell transistor MT. FIG. 5 depicts the distribution of threshold voltages of the cell transistors MT that hold 3-bit data per cell transistor as a result of programming. The threshold voltage of each cell transistor MT has a value corresponding to data which is held by the cell transistor MT. In the case of storage of 3 bits per cell transistor MT, each cell transistor MT can have any one of eight threshold voltages. The eight threshold voltages indicate states in which "111" data, "110" data, "100" data, "000" data, "010" data, "011" data, "001" data, and "101" data are held.

Even a plurality of cell transistors MT holding the same 3-bit data can have different threshold voltages due to, for example, variations in the characteristics of the cell transistors MT. Therefore, threshold voltages of a plurality of cell transistors MT holding the same data form one distribution. The distributions are referred to as Er, A, B, C, D, E, F, and G levels. Threshold voltages in the A level are higher than threshold voltages in the Er level. Likewise, threshold voltages in the B, C, D, E, F, and G levels are higher than threshold voltages in the A, B, C, D, E, and F levels, respectively. The Er level is the distribution of threshold voltages of the cell transistors MT in an erased state.

For a determination of data which is held by a cell transistor MT on which reading is to be performed, a level to which the threshold voltage of the cell transistor MT belongs is determined. For a level determination, read voltages VA, VB, VC, VD, VE, VF, and VG are used. Hereinafter, voltages including the voltages VA, VB, VC, VD, VE, VF, and VG, each having a certain value and being applied to a cell transistor MT, on which reading is to be performed, for a level determination, are sometimes referred to as read voltages VCGR.

A determination, as to whether or not a cell transistor MT on which reading is to be performed exceeds a certain read voltage VCGR, is used to determine a level to which the threshold voltage of this cell transistor MT belongs. The read voltage VA is higher than the highest threshold voltage of the cell transistors MT in the Er level and is lower than the lowest threshold voltage of the cell transistors MT in the B level, which is located between the Er level and the A level. Likewise, the read voltages VB, VC, VD, VE, and VF are located between the A level and the C level, between the B level and the D level, between the C level and the E level, between the D level and the F level, and between the E level and the G level, respectively. A cell transistor MT having a threshold voltage higher than or equal to the read voltage VCGR maintains an off state even when the cell transistor MT receives the read voltage VCGR at the control gate electrode. On the other hand, a cell transistor MT having a threshold voltage lower than the read voltage VCGR is turned on when the cell transistor MT receives the read voltage VCGR at the control gate electrode. A voltage VREAD is applied to the word line WL of a cell transistor MT of a cell unit CU on which reading is not to be performed and is higher than the threshold voltage of a cell transistor MT in any level.

At the time of programming, for verification of the completion of programming, program verification voltages (hereinafter referred to as "verification voltages") VVA, VVB, VVC, VVD, VVE, VVF, and VVG are used. Verification about a certain level refers to verification as to whether or not programming of a cell transistor MT, which is to be programmed to be in that level, such that the cell transistor MT is in the level is completed. If a cell transistor MT which is to be programmed to be in the A, B, C, D, E, F, or the G level has a threshold voltage of a magnitude greater than or equal to the verification voltage VVA, VVB, VVC, VVD, VVE, VVF, or VVG, a determination is made that programming of the cell transistor MT, which is to be programmed to be in that level, such that the cell transistor MT is in the level is completed. The verification voltages VVA, VVB, VVC, VVD, VVE, VVF, and VVG refer to voltages which are used for verifications of the A, B, C, D, E, F, and G levels, respectively. Hereinafter, voltages including the voltages VVA, VVB, VVC, VVD, VVE, VVF, and VVG, each having a certain value and being applied to a cell transistor MT, on which programming is to be performed, for verification of the completion of programming, are sometimes referred to as verification voltages VV. The verification voltages VVA, VVB, VVC, VVD, VVE, VVF, and VVG are higher than the read voltages VA, VB, VC, VD, VE, VF, and VG, respectively.

4. (Row Decoder)

Figure 6:
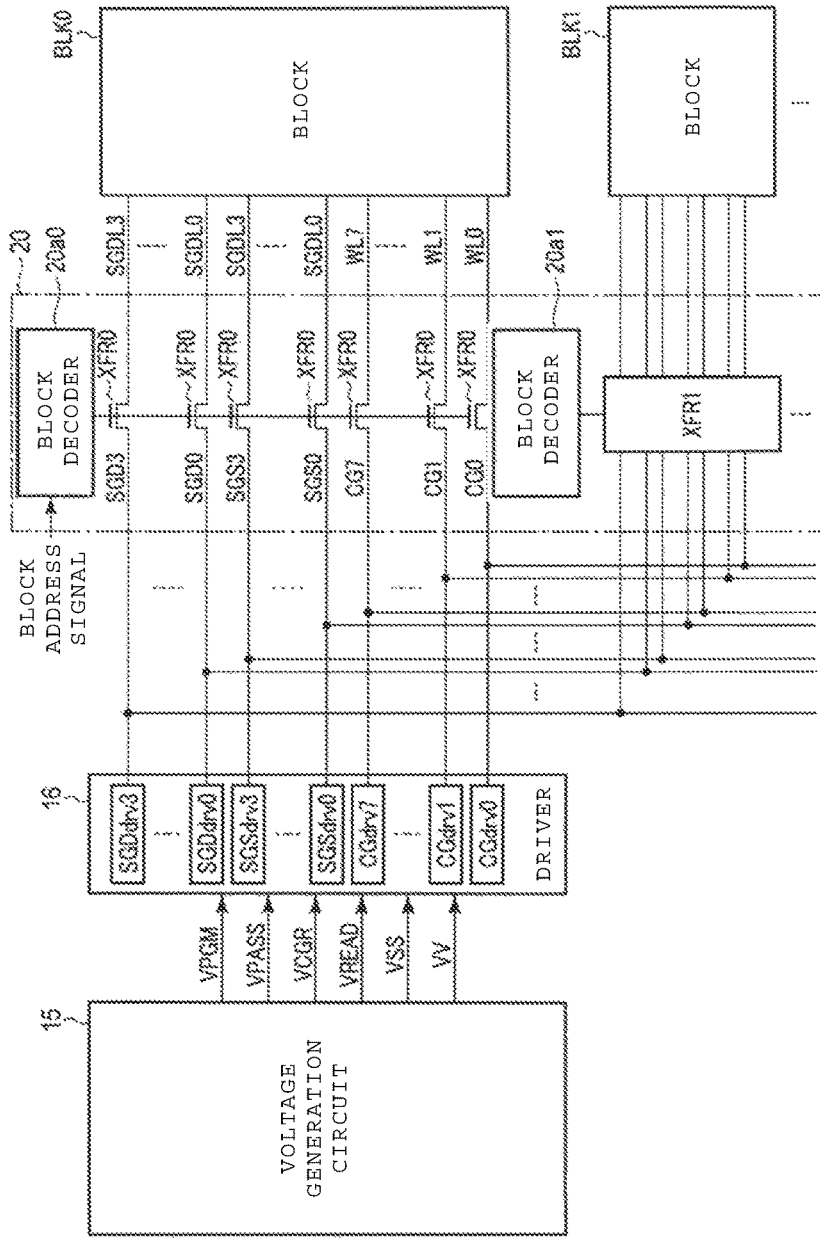
FIG. 6 depicts an example of elements and connections of a row decoder, a driver, and related blocks of the embodiment.

FIG. 6 depicts an example of elements and connections of the row decoder 20, the driver 16, and related blocks of the embodiment. As depicted in FIG. 6, the voltage generation circuit 15 generates voltages such as voltages VPGM, VPASS, VCGR, VREAD, VSS, and VV and supplies these voltages to the driver 16.

The driver 16 includes drivers SGDdrv0 to SGDdrv3, drivers SGSdrv0 to SGSdrv3, and drivers CGdrv0 to CGdrv7. The drivers SGDdrv0 to SGDdrv3, SGSdrv0 to SGSdrv3, and CGdrv0 to CGdrv7 receive various voltages from the voltage generation circuit 15. The drivers SGDdrv0 to SGDdrv3, SGSdrv0 to SGSdrv3, and CGdrv0 to CGdrv7 supply the received voltages to wiring lines SGD0 to SGD3, SGS0 to SGS3, and CG0 to CG7, respectively.

The wiring lines SGD0 to SGD3, SGS0 to SGS3, and CG0 to CG7 are connected to select gate lines SGDL0 to SGDL3, select gate lines SGSL0 to SGSL3, and word lines WL0 to WL7, respectively, of a block BLKp (p is 0 or a natural number) via a corresponding one transistor XFRp. The transistor XFRp receives, at the gate thereof, a signal from a block decoder 20ap. The block decoder 20a (20a0 to 20ap) is included in the row decoder 20 and receives a block address signal. The block address signal is part of the address signal. One block decoder 20a is selected by the block address signal, and the selected block decoder 20ap supplies the asserted signal to the transistor XFRp. As a result, the select gate lines SGDL0 to SGDL3 and SGSL0 to SGSL3 and the word lines WL0 to WL7 of only the selected block BLKp receive the voltages from the driver 16.

5. (Operation)

An operation of the memory device 1 of the embodiment will be described with reference to FIGS. 7 to 13. When the memory device 1 receives, from the memory controller 2, a command giving an instruction to perform programming, the memory device 1 performs programming on the designated cell unit CU on which programming is to be performed. The designated cell unit CU on which programming is to be performed is referred to as a selected cell unit CU. The cell transistors MT of the selected cell unit CU are referred to as selected cell transistors MT. The control gate electrode of the selected cell transistors MT is referred to as a selected word line WL. The remaining word lines WL are referred to as non-selected word lines WL. The cell transistors MT connected to the non-selected word lines WL are referred to as non-selected cell transistors MT. The string STR including the selected cell transistor MT is referred to as a selected string STR. The string unit SU including the selected cell unit CU is referred to as a selected string unit SU. The block BLK including the selected string unit SU is referred to as a selected block BLK.

Programming includes maintaining each of the selected cell transistors MT of the selected cell unit CU including only the selected cell transistors MT in an erased state in the Er level, or bringing each of the above selected cell transistors MT into the A, B, C, D, E, F, or G level, that is, causing the state to transition to a state in which the selected cell transistors MT hold the whole of the 3-bit data. That is, the selected cell transistors MT in an erased state are made to transition to a state in which the selected cell transistors MT hold 3-bit data without undergoing a state in which only data of less than 3 bits is programmed. For this purpose, specifically, for verification of selected cell transistors MT which are to be programmed to be in the A, B, C, D, E, F, and G levels of all the selected cell transistors MT, $2^3-1$ verification voltages VVA, VVB, VVC, VVD, VVE, VVF, and VVG are used and applied to the gates of the selected cell transistors MT which are to be programmed to be in the A, B, C, D, E, F, and G levels. Hereinafter, such programming is referred to as full-page programming. Full-page programming is sometimes referred to as simple "programming" without the designation of a level. In a commonly-used expression, in full-page programming, $2^n-1$ verification voltage is used if n (n is a natural number)-bit data is held per cell transistor MT.

Figure 7:
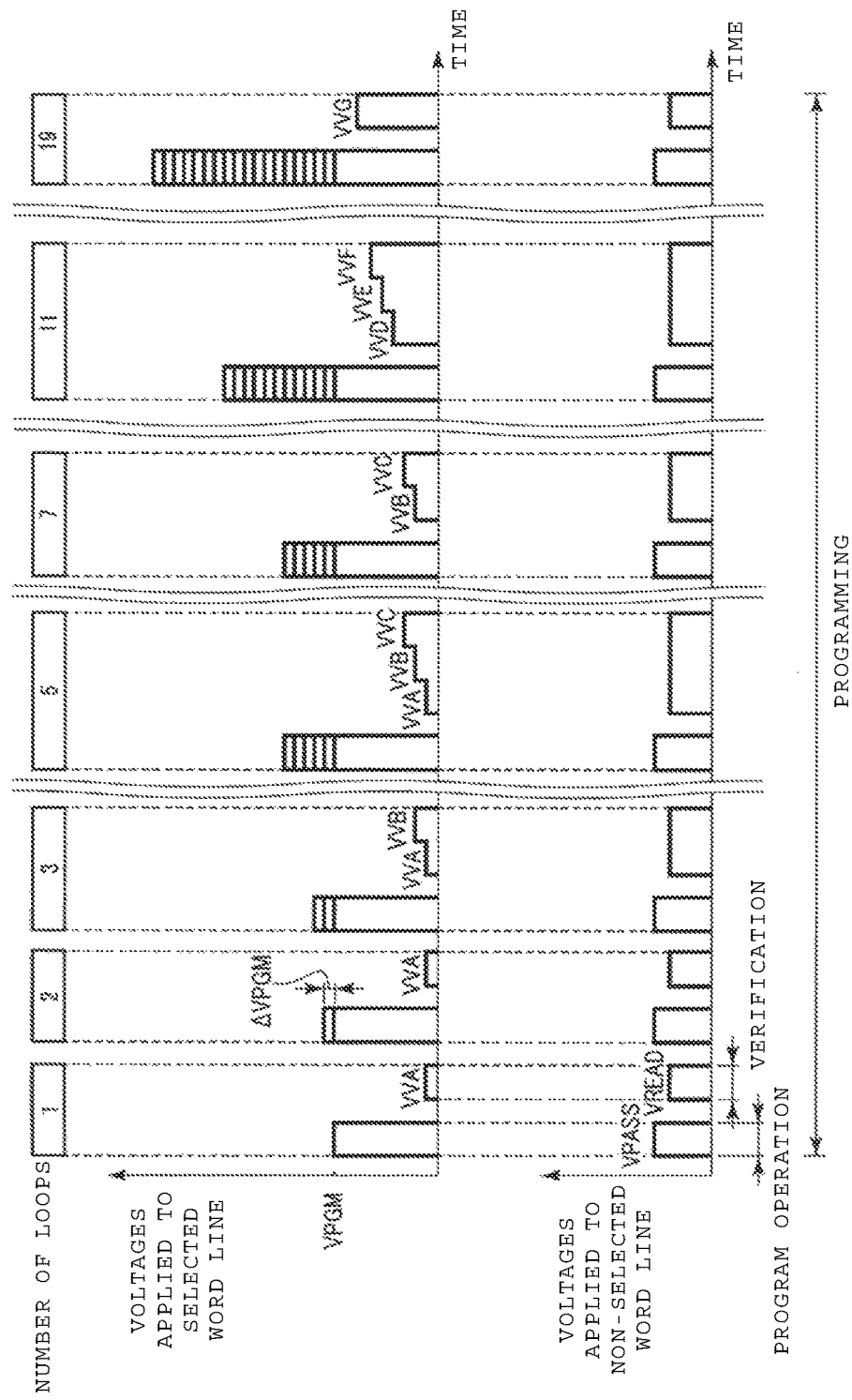
FIG. 7 depicts examples of voltages which are applied to a selected word line and a non-selected word line during full-page programming in the memory device of the embodiment.

FIG. 7 depicts voltages which are applied to the selected word line WL and the non-selected word line WL during full-page programming in the memory device 1 of the embodiment. Full-page programming includes execution of a plurality of program loops. Each program loop includes a set of a program operation and a program verification.

In the program operation, the control circuit 14 causes the string STR including a certain selected cell transistor MT of the selected cell unit CU to enter a programming enabled state and causes the strings STR including the remaining selected cell transistors MT to enter a programming disabled state. The string STR in a programming enabled state is in a state in which a program voltage can be applied to the selected cell transistor MT thereof. The strings STR in a programming disabled state are in a state in which an application of a program voltage to the selected cell transistors MT thereof is disabled. The string STR in a programming enabled state is electrically connected to the corresponding bit line BL, and the strings STR in a programming disabled state are electrically disconnected from the corresponding bit lines BL. In this state, the control circuit 14 applies the voltages VPGM and VPASS to the selected word line WL and the non-selected word line WL, respectively. The voltage VPASS has a magnitude that can increase a channel by coupling to the extent that an increase in the threshold voltage in the selected cell transistor MT can be prevented in the string STR in a programming disabled state while preventing the non-selected cell transistor MT from being programmed in the string STR in a programming enabled state. As a result of the application of the voltages VPGM and VPASS, a high program voltage is applied between a floating gate electrode and the pillar PL only in a selected cell transistor MT, on which programming is to be performed, of the selected cell transistors MT, and programming is performed.

Every time the number of program loops is increased, the program voltage VPGM is incremented by an increment ΔVPGM. The program voltage VPGM in a certain program loop is higher than the program voltage VPGM in the previous program loop by the increment ΔVPGM. In a first program loop, the program voltage VPGM is applied.

The program operation will be described in detail later with reference to FIGS. 10 and 11.

In verification, the control circuit 14 connects the string unit SU including the selected cell unit CU to the corresponding bit line BL and source line CELSRC and applies the verification voltage VV and the voltage VREAD to the selected word line WL and the non-selected word line WL, respectively. After the application, if the selected cell transistor MT has a threshold voltage higher than or equal to the verification voltage VV for a target level, the control circuit 14 determines that programming of the selected cell transistor MT is completed. In one verification, one or two or more different verification voltages VVs can be successively applied. This is because, even before verification of a certain level (for example, the A level) is passed, a selected cell transistor MT which is to be programmed to be in a level (for example, the B or C level) higher than the A level by one or two stages can pass verification of that level. Verification will be described in more detail later with reference to FIGS. 12 and 13.

Every time the program operation is performed, the distribution of the threshold voltages of the selected cell transistors MT transitions changes in a positive direction, that is, to a state with a higher voltage. If a determination is made that a certain proportion of all the selected cell transistors MT which are to be programmed (whose target level is an X level) to be in a certain X level (X is A, B, C, D, E, F, or G) have a threshold voltage higher than or equal to a verification voltage VVX, a determination is made that the program operation performed to program the cell transistors MT to be in the X level is completed (i.e., programming in the X level was passed). Alternatively, if a determination is made that a certain number of adjacent cell transistors MT whose target level is an X level have a threshold voltage higher than or equal to the verification voltage VVX, a determination is made that programming in the X level was passed. The percentage is determined based on the data error correction capability of the memory controller 2, for example.

If programming in a certain level is passed in a certain program loop, the control circuit 14 does not perform application of the verification voltage for that level in and after the next program loop. In the example of FIG. 7, verifications of the A level and the B level are performed from a third program loop, and, verifications of the A level, the B level, and the C level are performed from a fifth program loop. Furthermore, verification of the A level is passed in a sixth loop, and a program verification of the A level is not performed in and after a seventh loop. Likewise, the program loop is repeated until programming in all of the A to G levels is passed. When programming in the G level is passed, full-page programming is completed.

The control circuit 14 counts the number of repeated program loops and stores the number of program loops counted when programming in a certain level was passed, and the value of a programming voltage which is used in the program operation in a different level and (or) verification of a different level is adjusted from an initial value by using the stored number of program loops. A level whose number of program loops counted when programming in that level was passed is, for example, the A level. The levels whose values of program voltages are adjusted based on the number of program loops counted when programming in a certain level was passed are the B, C, D, E, F, and (or) G levels. The program voltage which is to be adjusted is one, more than one, or all of the increment $\Delta$VPGM, the verification voltages VVB, VVC, VVD, VVE, VVF, and VVG, and the voltage VREAD. Hereinafter, by using an example in which one or more program voltages are adjusted based on the number of loops counted when programming in the A level was passed or a number of the loops in which programming in the A level was passed (A-level pass loop number NAP), programming will be described in detail.

Figure 8:
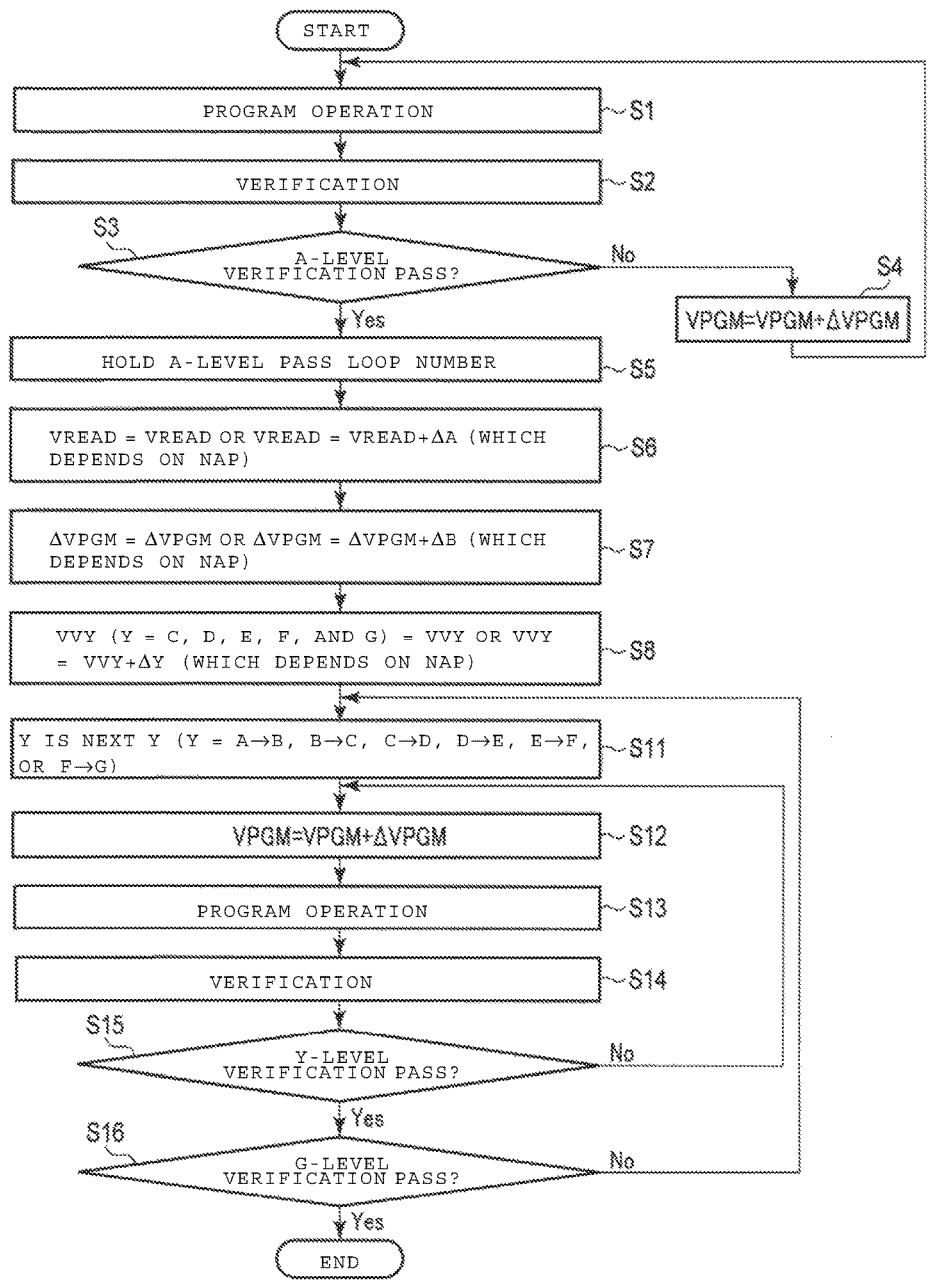
FIG. 8 is a flow diagram that depicts full-page programming of the memory device of the embodiment.

FIG. 8 depicts an example of the flow of full-page programming of the memory device 1 of the embodiment. The flow of FIG. 8 is started when the memory device 1 receives an instruction to perform full-page programming from the memory controller 2 and receives data of 3 pages for full-page programming.

As depicted in FIG. 8, the control circuit 14 performs the program operation in Step S1. Next, the control circuit 14 performs verification in Step S2. Verification includes verification of the A level and, in accordance with the number of loops, further includes verification of the B level or verifications of the B level and the C level.

In Step S3, the control circuit 14 determines whether or not verification of the A level was passed. Verification of the A level includes the use of the verification voltage VVA with a fixed initial value, for example. If verification of the A level was not passed (No in Step S3), in Step S4 in the flow, the program voltage VPGM is set at the sum of the current program voltage VPGM and the increment $\Delta$VPGM. The increment $\Delta$VPGM has the magnitude of the fixed initial value. After Step S4, the flow goes back to Step S1.

On the other hand, if verification of the A level was passed (Yes in Step S3), the control circuit 14 holds the A-level pass loop number NAP in the RAM 14a in Step S5.

The control circuit 14 continues full-page programming by steps including Step S6 and steps that follow by using the A-level pass loop number NAP. More specifically, an initial value is prepared for each voltage for programming, and the control circuit 14 uses an adjusted value obtained by adding an adjustment value based on the A-level pass loop number to the initial value. For this purpose, the control circuit 14 holds a table depicted in FIG. 9, for example, in the RAM 14a in the control circuit 14 while the memory device 1 is being supplied with power. The table is held by the cell transistor MT, for example, and is read into the RAM 14a when a supply of power to the memory device 1 is started. As depicted in FIG. 9, the values of the A-level pass loop number NAP are correlated with the adjustment values for the voltages VREAD, the increment $\Delta$VPGM, and the verification voltages VVC, VVD, VVE, VVF, and VVG.

The adjustment values are determined in advance by an experiment and a simulation, for example. The adjustment values may be dynamically changed while the memory device 1 is being supplied with power.

A first row indicates values for the program voltages in a case where the A-level pass loop number, which is greater than or equal to r (r is a natural number), is greater than or equal to r. The A-level pass loop number r is the number of loops counted when a cell transistor MT immediately after the production of the memory device 1, for example, that is, the cell transistor MT whose performance is not decreased through the use passes the A level. In the case of the A-level pass loop number r, the initial values are used for all the program voltages. That is, the adjustment values are not added.

The voltage VREAD is adjusted such that, the smaller the A-level pass loop number NAP becomes, the greater the value of the voltage VREAD becomes. For this purpose, a plurality of A-level pass loop numbers NAP are correlated with adjustment values $\Delta$A1, $\Delta$A2, . . . for the voltage VREAD in descending order of the A-level pass loop numbers NAP. All the adjustment values $\Delta$A ($\Delta$A1, $\Delta$A2, . . . ) are positive values. A difference between two values $\Delta$A in the adjacent two rows may be the same in all the pairs of the two values $\Delta$A or may be different in different pairs. As for the other program voltages, which will be described later, a difference between the two values may be the same in all the pairs of the two values or may be different in different pairs.

The increment $\Delta$VPGM is adjusted such that, the smaller the A-level pass loop number NAP becomes, the smaller the increment $\Delta$VPGM becomes. For this purpose, the plurality of A-level pass loop numbers NAP are correlated with adjustment values $\Delta$B1, $\Delta$B2, . . . for the increment $\Delta$VPGM in descending order of the A-level pass loop numbers NAP. All the adjustment values $\Delta$B ($\Delta$B1, $\Delta$B2, . . . ) are negative values.

The increment $\Delta$VVC is adjusted such that, the smaller the A-level pass loop number NAP becomes, the greater the value of the increment $\Delta$VVC becomes. For this purpose, the plurality of A-level pass loop numbers NAP are correlated with adjustment values $\Delta$C1, $\Delta$C2, . . . for the increment $\Delta$VVC in descending order of the A-level pass loop numbers NAP. All the adjustment values $\Delta$C ($\Delta$C1, $\Delta$C2, . . . ) are positive values.

The voltage $\Delta$VVD is adjusted such that, the smaller the A-level pass loop number NAP becomes, the greater the value of the voltage $\Delta$VVD becomes. For this purpose, the plurality of A-level pass loop numbers NAP are correlated with adjustment values $\Delta$D1, $\Delta$D2, . . . for the voltage $\Delta$VVD in descending order of the A-level pass loop numbers NAP. All the adjustment values $\Delta$D ($\Delta$D1, $\Delta$D2, . . . ) are positive values.

The voltage $\Delta$VVE is adjusted such that, the smaller the A-level pass loop number NAP becomes, the greater the value of the voltage $\Delta$VVE becomes. For this purpose, the plurality of A-level pass loop numbers NAP are correlated with adjustment values $\Delta$E1, $\Delta$E2, . . . for the voltage $\Delta$VVE in descending order of the A-level pass loop numbers NAP. All the adjustment values $\Delta$E ($\Delta$E1, $\Delta$E2, . . . ) are positive values.

The voltage $\Delta$VVF is adjusted such that, the smaller the A-level pass loop number NAP becomes, the greater the value of the voltage $\Delta$VVF becomes. For this purpose, the plurality of A-level pass loop numbers NAP are correlated with adjustment values $\Delta$F1, $\Delta$F2, . . . for the voltage $\Delta$VVF in descending order of the A-level pass loop numbers NAP. All the adjustment values ΔF (ΔF1, ΔF2, . . . ) are positive values.

The voltage ΔVVG is adjusted such that, the smaller the A-level pass loop number NAP becomes, the greater the value of the voltage ΔVVG becomes. For this purpose, the plurality of A-level pass loop numbers NAP are correlated with adjustment values ΔG1, ΔG2, . . . for the voltage ΔVVG in descending order of the A-level pass loop numbers NAP. All the adjustment values ΔG (ΔG1, ΔG2, . . . ) are positive values.

One of the adjustment values ΔC, ΔD, ΔE, ΔF, and ΔG for a certain A-level pass loop number NAP may be the same as a different adjustment value for that A-level pass loop number NAP or may be different therefrom.

The higher the level is, the greater an adjustment value in that level can be set for a certain A-level pass loop number NAP. The reason is as follows. By an adjustment made to the verification voltage VV in a certain first level, the first level is in a position higher than a position which would be observed if the first verification voltage VV was not adjusted, and, in order to ensure an interval between the first level and a level lower than the first level by one stage, the first level has to be elevated by an amount greater than the amount of accumulated elevations of all the lower levels using the adjusted verification voltage. That is, for example, in order to ensure an interval between the E level and the D level, the adjustment value in the E level has to be greater than the sum of the adjustment values in levels lower than the E level when the verification voltage is not adjusted and the adjustment value of the verification voltage VVD.

Back in FIG. 8, after Step S5, Step S6 is performed. In Step S6, the control circuit 14 determines whether the initial value of the voltage VREAD or an adjusted voltage VREAD+ΔA is used in and after Step S11. A determination as to whether the initial value is used or not and a determination as to which adjustment value ΔA is used depend on the A-level pass loop number NAP. That is, by referring to the table of FIG. 9, the control circuit 14 obtains the adjustment value of zero or a value of the adjustment values ΔA which corresponds to the held A-level pass loop number NAP. Then, the control circuit 14 calculates the sum of the value thus obtained and the voltage VREAD as the adjusted voltage VREAD+ΔA and uses the initial value of the voltage VREAD or the adjusted voltage VREAD+ΔA in and after Step S11.

In Step S7, the control circuit 14 determines whether the initial value of the increment ΔVPGM or an adjusted increment ΔVPGM+ΔB is used in and after Step S11. A determination as to whether the initial value is used or not and a determination as to which adjustment value ΔB is used depend on the A-level pass loop number NAP. That is, by referring to the table of FIG. 9, the control circuit 14 obtains the adjustment value of zero or a value of the adjustment values ΔB which corresponds to the held A-level pass loop number NAP. Then, the control circuit 14 calculates the sum of the value thus obtained and the increment ΔVPGM as the adjusted increment ΔVPGM+ΔB and uses the initial value of the increment ΔVPGM or the adjusted increment ΔVPGM+ΔB in and after Step S11.

In Step S8, the control circuit 14 determines whether the initial value of the verification voltage VVY (Y is C, D, E, F, and (or) G) or an adjusted verification voltage VVY+ΔY is used in and after Step S11. A determination as to whether the initial value is used or not and a determination as to which adjustment value ΔY is used depend on the A-level pass loop number NAP. That is, by referring to the table of FIG. 9, the control circuit 14 obtains the adjustment value of zero or a value of the adjustment values ΔY which corresponds to the held A-level pass loop number NAP. Then, the control circuit 14 calculates the sum of the value thus obtained and the verification voltage VVY as the adjusted verification voltage VVY+ΔY and uses the initial value of the verification voltage VVY or the adjusted verification voltage VVY+ΔY in and after Step S11.

Steps S6, S7, and S8 may be performed in an order different from the above-described order depicted in FIG. 8. Moreover, one or more of Steps S6, S7, and S8 may be omitted.

In Step S11, the value of Y of the Y level is changed to next Y. Y is changed to B, C, D, E, F, or G. In Step S12, the control circuit 14 sets the program voltage VPGM at the sum of the current program voltage VPGM and the increment ΔVPGM. In Step S13, the control circuit 14 performs the program operation. In Step S14, the control circuit 14 performs verification. Verification includes at least verification of the Y level and further includes verifications of one or more levels higher than the Y level in accordance with the number of loops. Verification of the B level includes the use of the voltage VVB with a fixed initial value, for example.

Y is one or more of C, D, E, F, and G. That is, in Steps S13 and S14, for one or more of the C, D, E, F, and G levels, the verification voltage VV and the increment ΔVPGM are adjusted. The reason is as follows.

The level in which the program operation and (or) verification are performed by using the adjusted voltage is considered to be a level higher than or equal to the B level. However, as described above, even before verification of the A level is passed, verification of the B level is already performed. For this reason, for example, one or more of the values of the voltages in the program operation and/or verification about a level whose verification is not started before verification of the A level is passed are adjusted. Specifically, in a loop in which verification in Step S13 when Y=C, D, E, F, and G levels is performed, one or more of the voltages in the program operation and (or) verification are adjusted.

More practically, since verifications of the A, B, and C levels are consecutively performed in a certain loop, in a loop in which verifications of the D, E, F, and G levels are performed, one or more of the voltages in the program operation and (or) verification are adjusted. That is, in a loop including verifications of the D, E, F, and G levels, one or more of the voltage VREAD, the increment ΔVPGM, the verification voltages VVD, VVE, VVF, and VVG are adjusted.

In Step S15, the control circuit 14 determines whether or not verification of the Y level was passed. If verification of the Y level failed (No in Step S15), the flow goes back to Step S12. On the other hand, if verification of the Y level was passed (Yes in Step S15), the flow proceeds to Step S16.

In Step 516, the control circuit 14 determines whether or not verification of the G level was passed. If verification of the G level failed (No), verifications of all the levels were not passed, that is, programming in all the levels was not passed and therefore the flow goes back to Step S11. On the other hand, if verification of the G level was passed (Yes), the flow of full-page programming is ended.

Figure 10:
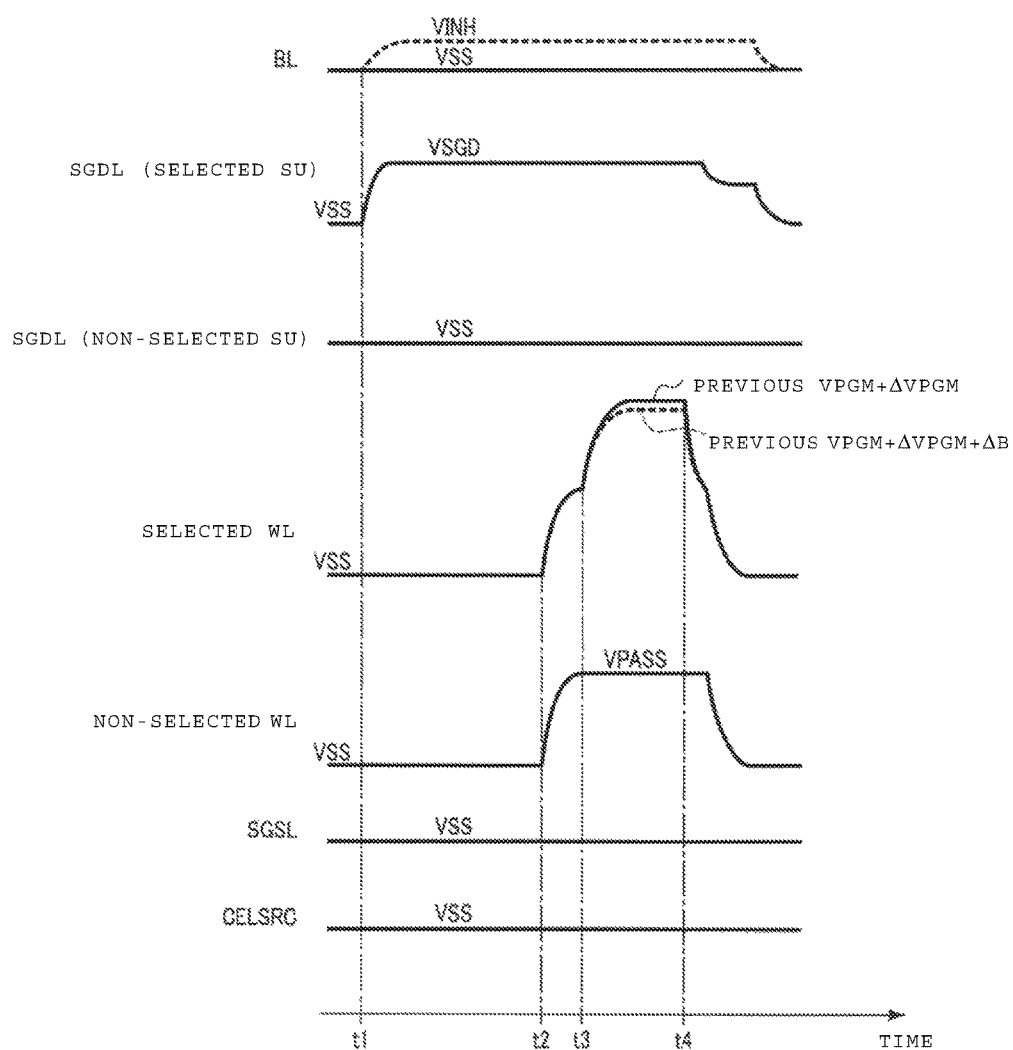
FIG. 10 is a timing diagram that depicts voltages which are applied to elements during the operation of the memory device of the embodiment.
Figure 11:
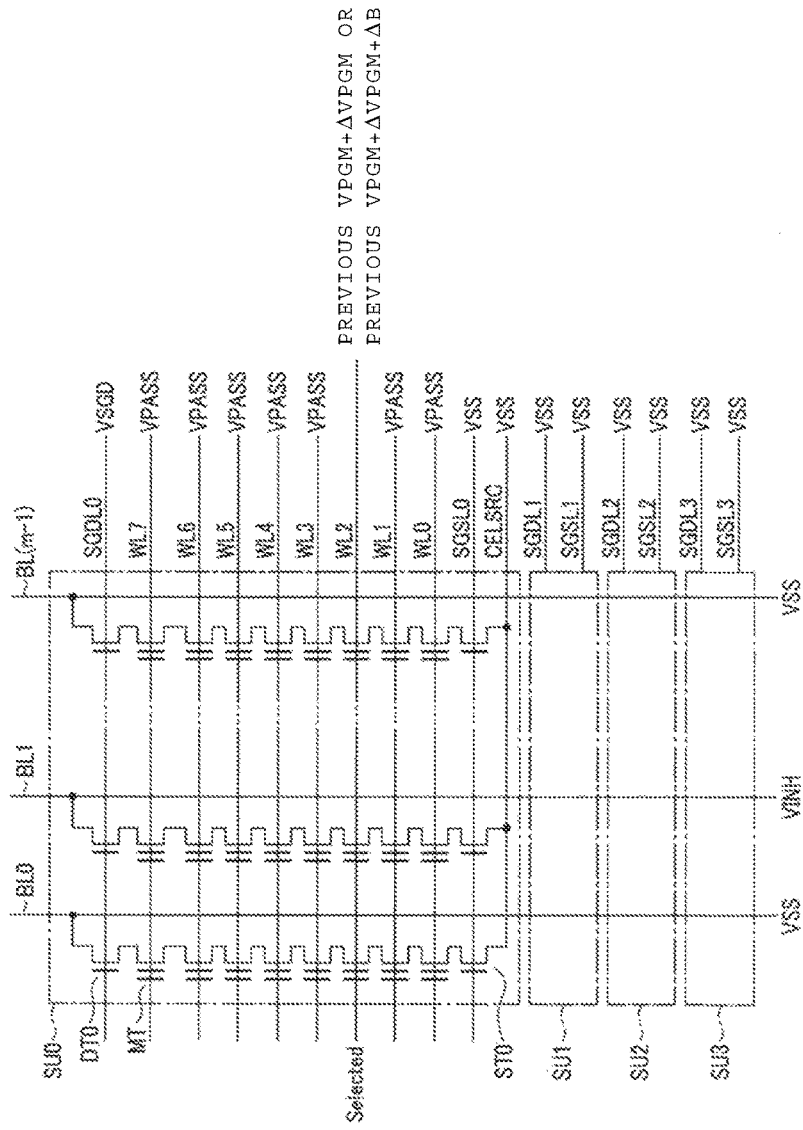
FIG. 11 depicts one state during the operation of the memory device of the embodiment.
Figure 12:
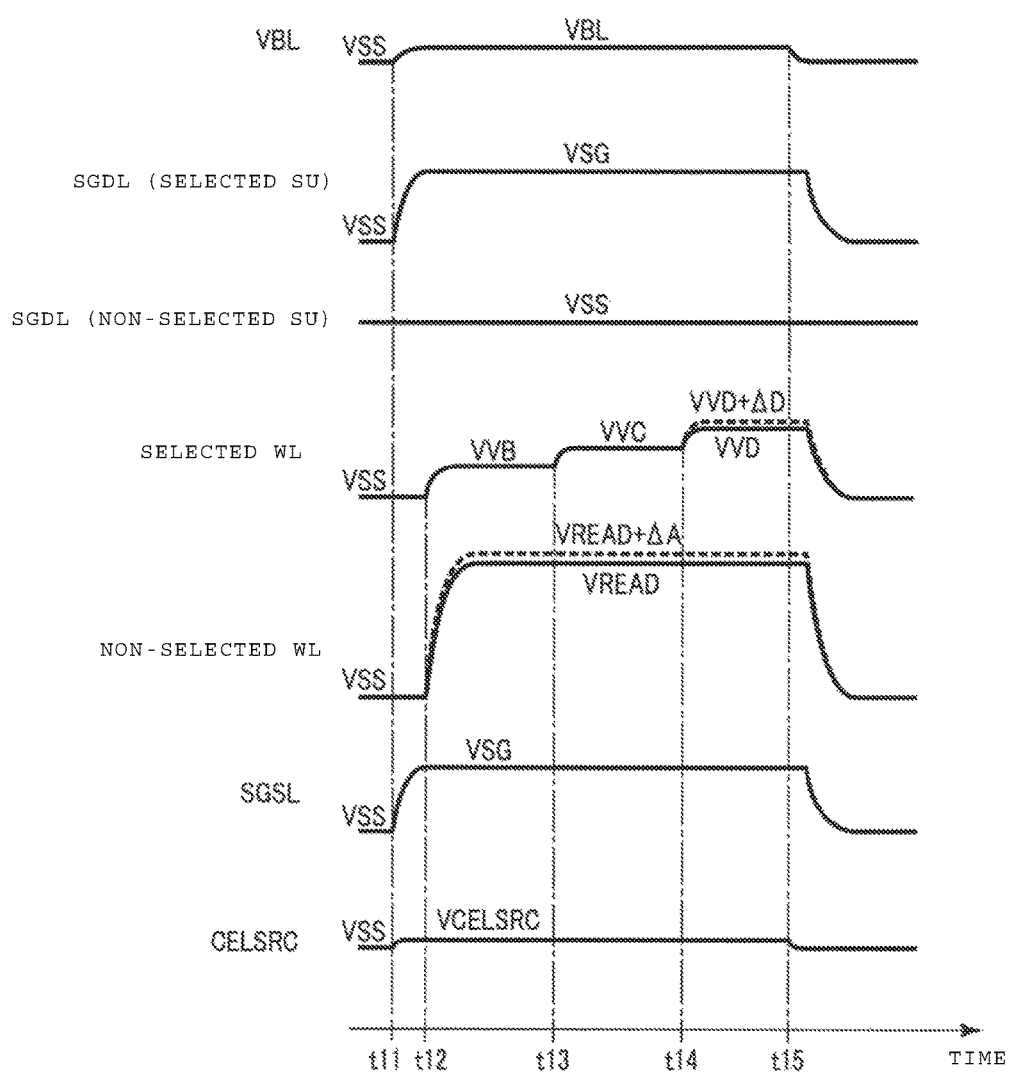
FIG. 12 is a timing diagram that depicts voltages which are applied to elements during the operation of the memory device of the embodiment.
Figure 13:
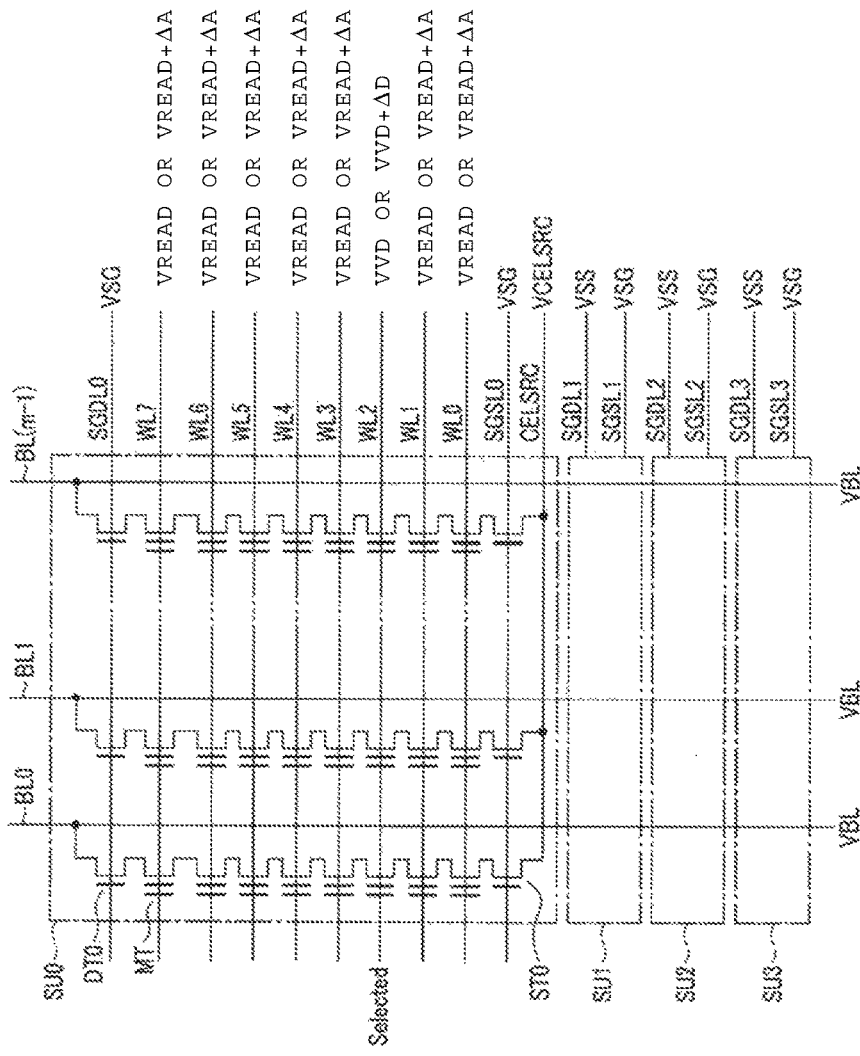
FIG. 13 depicts one state during the operation of the memory device of the embodiment.

The voltages which are applied to some elements in the selected block BLK in some steps of FIG. 8 are depicted in FIGS. 10 to 13. FIG. 10 depicts the voltages which are applied to some elements in Step S1 or S13 in chronological order. FIG. 11 depicts a state between times t3 and t4 of FIG. 10. FIG. 12 depicts the voltages which are applied to some elements in Step S14 in chronological order. FIG. 13 depicts a state between times t14 and t15 of FIG. 12. FIGS. 12 and 13 depict, as an example, the program operation performed to program the cell transistors MT to be in the B, C, and D levels. Moreover, FIG. 13 depicts, as an example, a case in which the verification voltage VDD of the D level is adjusted and the verification voltage VCC of the C level is not adjusted. The reason will be described later.

In the program operation, some of the plurality of selected cell transistors MT receive the program voltage such that the threshold voltages thereof are increased and, to the remaining selected cell transistors MT, the program voltage is not applied. Hereinafter, the string STR including the selected cell transistor that receives the program voltage will be referred to as a programming enabled string STR. On the other hand, the string STR including the selected cell transistor that does not receive the program voltage will be referred to as a programming disabled string STR.

As depicted in FIG. 10, during the program operation, the control circuit 14 maintains all the select gate lines SGDL (for example, select gate lines SGDL1, SGDL2, and SGDL3), all the select gate lines SGSL, and the cell source line CELSRC of the non-selected string unit SU at the voltage VSS.

During the program operation, the control circuit 14 keeps applying the voltage VSS to the bit line BL (for example, the bit line BL0) connected to the programming enabled string STR. On the other hand, from time t1, the control circuit 14 applies a voltage VINH to the bit line BL (for example, the bit line BL1) connected to the programming disabled string STR. The voltage VINH is higher than the voltage VSS.

Moreover, from time t1, the control circuit 14 keeps applying a voltage VSGD to the select gate line SGDL (for example, the select gate line SGDL0) of the selected string unit SU (for example, the string unit SU0). The voltage VSGD has a magnitude that turns on the select gate transistor DT in the programming enabled string STR and maintains the select gate transistor DT in the programming disabled string STR in an off state. As a result of the application of the voltage VSGD, the select gate transistor DT of the programming enabled string STR in the selected string unit SU is turned on. On the other hand, even after the application of the voltage VSGD, the select gate transistor DT of the programming disabled string STR in the selected string unit SU maintains an off state.

From time t2, the control circuit 14 keeps applying the voltage VPASS to all the word lines WL. Moreover, from time t3, the control circuit 14 applies, to the selected word line WL (for example, the word line WL2), the sum of the previous program voltage VPGM and the initial value of the increment ΔVPGM or the sum of the previous program voltage VPGM and the adjusted increment ΔVPGM+ΔB. As a result of the application of the voltage from time t2, the program voltage is applied to the selected cell transistor MT included in the programming enabled string STR. On the other hand, to the selected cell transistor MT included in the programming disabled string STR, the program voltage is not applied. In the non-selected string unit SU, the program voltage is not applied to any cell transistors MT. In a period from time t4, the control circuit 14 returns the voltages of the wiring lines depicted in FIG. 10 to the voltage Vss.

As depicted in FIG. 12, from time t11, the control circuit 14 keeps applying a voltage VBL to the bit line BL and keeps applying a voltage VCELSRC to the source line CELSRC. The voltage VCELSRC is higher than the voltage VSS, and the voltage VBL is higher than the voltage VCELSRC. Moreover, from time t11, the control circuit 14 applies a voltage VSG to the select gate line SGDL (for example, the select gate line SGDL0) of the selected string unit SU (for example, the string unit SU0). The voltage VSG is higher than the voltage VSS and has a magnitude that turns on the select gate transistors DT and ST. On the other hand, during verification, the control circuit 14 maintains the select gate line SGDL of the non-selected string unit SU at the voltage VSS. Moreover, from time t11, the control circuit 14 applies the voltage VSG to all the select gate lines SGSL. As a result of the application of the voltage VSG to the select gate lines SGSL, a channel connecting the pillar PL and the diffusion layer DN is formed below the transistor ST.

From time t12, the control circuit 14 keeps applying the initial value of the voltage VREAD or the adjusted voltage VREAD+ΔA to the non-selected word line WL. As a result, the non-selected cell transistor MT is turned on.

Moreover, from time t12, the control circuit 14 applies the verification voltage VVB to the selected word line WL (for example, the word line WL2). Of the selected cell transistors MT, the selected cell transistor MT having the threshold voltage higher than the voltage VVB maintains an off state and the selected cell transistor MT having the threshold voltage lower than the voltage VVB is turned on. The selected cell transistor MT which was turned on forms a current path between the bit line BL and the source line CELSRC via the string STR including the selected cell transistor MT which was turned on. A cell current flows through this current path. The presence or absence of the current path is detected by the sense amplifier 17. The control circuit 14 determines whether or not the selected cell transistor MT to be programmed to be in the B level passed verification of the B level by using the presence or absence of the current path for this determination.

From time t13, the control circuit 14 applies the voltage VVC to the selected word line WL and performs verification of the C level. From time t14, the control circuit 14 applies the initial value of the voltage VVD or the adjusted voltage VVD+ΔD to the selected word line WL and performs verification of the D level. In a period from time t15, the control circuit 14 returns the voltages of the wiring lines depicted in FIG. 12 to the voltage Vss.

6. (Effects)

If programming of data into the cell transistor MT and erasing of data therefrom are repeated, the characteristics of the cell transistor MT are degraded. The causes of degradation include the formation of a defect in the tunnel insulator IT and the capture of an electron in the defect. The captured electron makes the threshold voltage of the cell transistor MT higher than the threshold voltage observed before degradation and facilitates storage of charge in the charge storage layer CA. That is, the degraded cell transistor MT is programmed more easily than the cell transistor MT which is not degraded, which means that the threshold voltage of the degraded cell transistor MT is increased to a target value more easily than the threshold voltage of the cell transistor MT which is not degraded. This at least partly causes the distribution of the threshold voltages of a plurality of cell transistors MT in which more significant degradation is observed tends to spread more widely than the distribution of the threshold voltages of the cell transistors MT in which less significant degradation is observed. As a result, only a small interval is provided between the threshold voltage distribution of the degraded cell transistors MT on which programming was performed and the threshold voltage distribution adjacent thereto, which results in a low read margin.

As described above, the degraded cell transistor MT is more easily programmed. As a result, the number of loops required for the completion of programming of the degraded cell transistor MT such that the degraded cell transistor MT is in a certain level is smaller than the number of loops required for the completion of programming of the cell transistor MT which is not degraded such that the cell transistor MT is in that level. That is, there is a correlation between the number of loops required for the completion of verification of a certain level and the degree of degradation of the cell transistor MT. Moreover, all the cell transistors MT in one cell unit CU are considered to be equally degraded because the cell transistors MT in each cell unit CU are programmed and subjected to erasing of data in parallel.

Furthermore, degradation of the cell transistor MT can narrow the interval between the right edge of the highest G level and VREAD. This leads to a situation in which the cell transistor MT having the threshold voltage whose magnitude is close to the right edge of the G level does not receive a sufficiently large voltage at the gate thereof and can eventually result in a situation in which this cell transistor MT is not sufficiently turned on. This can result in an error in the result of verification and eventually unsuccessful programming.

In full-page programming, the memory device 1 of the embodiment counts the number of loops from the start of programming and holds the number of loops NAP counted when verification of the A level was passed. Then, the memory device 1 adjusts one or a plurality of values of the voltages in the program operation and (or) verification for a different level by using the adjustment value which is determined based on the held A-level pass loop number NAP.

The number of loops NAP counted when verification of the A level was passed in a certain cell unit CU can reflect the degree of degradation of the cell transistors MT of this cell unit CU. Based on this fact, the voltages which are used in the program operation and verification for a different level are adjusted based on the A-level pass loop number NAP. The adjustment can make the shapes and positions of the threshold voltages in the level which are subjected to the adjustment, the shapes and positions after programming, close to more desirable shapes and positions than shapes and positions without the adjustment. The following are the details of an improvement in the shape of the threshold voltage distribution achieved by the adjustment.

With the adjustment of the increment $\Delta$VPGM, the shape of the distribution of the threshold voltages of the cell transistors MT which are to be programmed by using the adjusted increment $\Delta$VPGM+$\Delta$B can be more finely adjusted. The specifics are as follows. The amount of an increase in the threshold voltage of the cell transistor MT which does not pass verification in a case where the adjusted increment $\Delta$VPGM+$\Delta$B is used is smaller than the amount of an increase which would be observed in a case where the initial value of the increment $\Delta$VPGM is used. Therefore, the distribution of the threshold voltages after the completion of programming has a narrower width than the width which would be observed when the initial value of the increment $\Delta$VPGM is used. As a result, the interval between the adjacent levels can be ensured, which leads to an improvement in a read margin.

With the adjustment of the verification voltage VVY (Y is C, D, E, F, or G), the interval between the Y level and the level adjacent thereto can be ensured. The specifics are as follows. As described earlier, the threshold voltage distribution of the degraded cell transistors MT tends to spread. On the other hand, as a result of the use of the adjusted verification voltage VVY+$\Delta$Y, the left edge of the Y level is located in a position closer to the right side than the left edge of the Y level which would be obtained by the use of the initial value of the verification voltage VVY. As a result, the interval between the Y level and a level lower than the Y level by one stage is wider than the interval which would be observed when the initial value of the verification voltage VVY is used, which leads to an improvement in a read margin.

With the adjustment of the voltage VREAD, a more correct result of verification can be obtained. That is, with the adjustment of the voltage VREAD, the interval between the right edge of the G level closest to the voltage VREAD and the adjusted voltage VREAD+$\Delta$A can be ensured. In particular, if the verification voltages VVD, VVE, VVF, and VVG are adjusted, the D, E, F, and G levels have values higher than the values which would be observed when the initial values are used (i.e., are located in positions closer to the right side). Therefore, based on the fact that the interval between the right edge of the G level and the voltage VREAD becomes small as a result of the adjustment, the voltage VREAD is also adjusted when the verification voltages VVD, VVE, VVF, and VVG are adjusted. By so doing, even when the G level is located in a position significantly closer to the right side as a result of the adjustment of the voltage VREAD than the position which would be observed when the initial value of the voltage VREAD is used, the interval between the G level and the voltage VREAD can be ensured. If the interval between the G level and the voltage VREAD is ensured, a more correct result of verification and, eventually, a more correct programming result can be obtained.

7. (Others)

The above description deals with an example in which 3-bit data is stored per cell transistor, that is, an example of a total of eight levels. The embodiment is not limited to this example. For example, data of 4 bits or more may be stored per cell transistor. In that case, an adjustment of the voltage can be performed for a level higher than or equal to the C or D level, for example.

Moreover, the above description deals with an example in which an adjustment of the voltage is performed for a level higher than or equal to the C or D level based on the A-level pass loop number NAP. The embodiment is not limited to this example. For example, an adjustment of the voltage may be started from a loop next to the loop in which verification of the A level was passed. In that case, as in the case of FIG. 9, adjustment values for the verification voltage VV for various A-level pass loop numbers NAP are prepared and an adjustment value based on the A-level pass loop number NAP is used.

While certain embodiments have been described, these embodiments have been presented by way of example only, and are not intended to limit the scope of the inventions. Indeed, the novel embodiments described herein may be embodied in a variety of other forms. Furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device comprising:
a plurality of memory cell transistors;
a word line electrically connected to gates of the memory cell transistors; and
a control circuit configured to perform programming of the memory cell transistors to a plurality of different threshold voltage ranges in a plurality of loops, each loop including a program operation and a program verification, wherein
the different threshold voltage ranges include a first threshold voltage range and a second threshold voltage range that is at a higher voltage than the first threshold voltage range, and
during the program operation, the control circuit applies a program voltage to the word line, the program voltage increasing for each subsequent loop, an amount of increase of the program voltage when programming to the second threshold voltage range being set in accordance with a number of loops required to complete programming to the first threshold voltage range.

2. The memory device according to claim 1, wherein
during the program verification, the control circuit applies a first verification voltage to the word line when performing verification of the programming to the first threshold voltage range, and a second verification voltage to the word line when performing verification of the programming to the second threshold voltage range, the second verification voltage being higher than the first verification voltage.

3. The memory device according to claim 2, wherein the control circuit sets the second verification voltage in accordance with the number of loops required to complete programming to the first threshold voltage range.

4. The memory device according to claim 2, wherein the different threshold voltage ranges do not overlap and each of the first and second verification voltages are between two adjacent threshold voltage ranges.

5. The memory device according to claim 4, wherein the first verification voltage is between first and second threshold voltage ranges, and the second verification voltage is between the second threshold voltage range and a third threshold voltage range.

6. The memory device according to claim 1, wherein
the memory cell transistors hold n-bit data, where n is a natural number, and
the different threshold voltage ranges include $2^n-1$ different threshold voltage ranges.

7. The memory device according to claim 1, wherein completion of the programming to the first threshold voltage range is achieved when threshold voltages of all the memory cell transistors that are targeted for programming to the first threshold voltage range are in the first threshold voltage range.

8. A memory device comprising:
a plurality of memory cell transistors;
a word line electrically connected to gates of the memory cell transistors; and
a control circuit configured to perform programming of the memory cell transistors to a plurality of different threshold voltage ranges in a plurality of loops, each loop including a program operation and a program verification, wherein
the different threshold voltage ranges include a first threshold voltage range and a second threshold voltage range that is at a higher voltage than the first threshold voltage range, and
during the program verification, the control circuit applies a first verification voltage to the word line when performing verification of the programming to the first threshold voltage range, and a second verification voltage to the word line when performing verification of the programming to the second threshold voltage range, the second verification voltage being higher than the first verification voltage and the control circuit setting the second verification voltage in accordance with a number of loops required to complete programming to the first threshold voltage range.

9. The memory device according to claim 8, wherein the different threshold voltage ranges do not overlap and each of the first and second verification voltages are between two adjacent threshold voltage ranges.

10. The memory device according to claim 9, wherein the first verification voltage is between first and second threshold voltage ranges, and the second verification voltage is between the second threshold voltage range and a third threshold voltage range.

11. The memory device according to claim 8, wherein
the memory cell transistors holds n-bit data, where n is a natural number, and
the different threshold voltage ranges include $2^n-1$ different threshold voltage ranges.

12. The memory device according to claim 8, wherein completion of the programming to the first threshold voltage range is achieved when threshold voltages of all the memory cell transistors that are targeted for programming to the first threshold voltage range are in the first threshold voltage range.

13. A method for programming memory cell transistors of a memory device to a plurality of different threshold voltage ranges in a plurality of loops, each loop including a program operation and a program verification, the method comprising:
during the program operation, applying a program voltage to a word line that is connected to gates of the memory cell transistors, the program voltage increasing for each subsequent loop, an amount of increase of the program voltage when programming to a second threshold voltage range being set in accordance with a number of loops required to complete programming to a first threshold voltage range.

14. The method according to claim 13, wherein
during the program verification, a control circuit applies a first verification voltage to the word line when performing verification of the programming to the first threshold voltage range, and a second verification voltage to the word line when performing verification of the programming to the second threshold voltage range, the second verification voltage being higher than the first verification voltage.

15. The method according to claim 14, further comprising:
setting the second verification voltage in accordance with the number of loops required to complete programming to the first threshold voltage range.

16. The method according to claim 14, wherein the different threshold voltage ranges do not overlap and each of the first and second verification voltages are between two adjacent threshold voltage ranges.

17. The method according to claim 16, wherein the first verification voltage is between first and second threshold voltage ranges, and the second verification voltage is between the second threshold voltage range and a third threshold voltage range.

18. The method according to claim 13, wherein
the memory cell transistors hold n-bit data, where n is a natural number, and
the different threshold voltage ranges include $2^n-1$ different threshold voltage ranges.

19. The method according to claim 13, wherein completion of the programming to the first threshold voltage range is achieved when threshold voltages of the memory cell transistors that are targeted for programming to the first threshold voltage range are in the first threshold voltage range.

* * * * *